(12) United States Patent
Matsumura

(10) Patent No.: US 6,766,895 B2
(45) Date of Patent: Jul. 27, 2004

(54) WORK CONVEYING SYSTEM AND TRAVELING PATH SEALING STRUCTURE IN THE WORK CONVEYING SYSTEM

(75) Inventor: Kazuyuki Matsumura, Tokyo (JP)

(73) Assignee: Hirata Corporation (JP)

( * ) Notice: Subject to any disclaimer, the term of this patent is extended or adjusted under 35 U.S.C. 154(b) by 0 days.

(21) Appl. No.: 10/230,275

(22) Filed: Aug. 29, 2002

(65) Prior Publication Data

US 2003/0106776 A1 Jun. 12, 2003

(30) Foreign Application Priority Data

Sep. 3, 2001 (JP) .................................... 2001-265177

(51) Int. Cl.[7] .............................................. B65G 45/00
(52) U.S. Cl. ........................ 198/495; 414/940; 384/15
(58) Field of Search ........................ 198/495; 414/940; 384/15

(56) References Cited

U.S. PATENT DOCUMENTS

| | | | | |
|---|---|---|---|---|
| 3,563,203 A | * | 2/1971 | Stiltner | 118/324 |
| 4,207,833 A | * | 6/1980 | Napadow | 118/324 |
| 4,376,543 A | * | 3/1983 | Sakagami | 277/345 |
| 4,892,416 A | * | 1/1990 | Hassler et al. | 384/58 |
| 5,658,078 A | * | 8/1997 | Cawley | 384/7 |
| 6,547,320 B2 | * | 4/2003 | Kohout et al. | 296/223 |

FOREIGN PATENT DOCUMENTS

| JP | 5-39030 | 2/1993 |
|---|---|---|
| JP | 5-116885 | 5/1993 |
| JP | 7-291123 | 11/1995 |
| JP | 2000-243808 | 9/2000 |

* cited by examiner

*Primary Examiner*—Richard Ridley
(74) *Attorney, Agent, or Firm*—Lorusso, Loud & Kelly

(57) ABSTRACT

In a work conveying system including at least a work holder for holding a work and a horizontal mover for moving the work holder horizontally in an upper ceiling space within a clean room, the work being conveyed to each of plural processing apparatuses. The horizontal mover has at least one linear moving mechanism including a duct with an internal guide, a traveling body engaging the guide and traveling through the traveling path defined by the duct, and a slider connected to the traveling body for travel with the traveling body on the exterior of the traveling path. The work holder is attached to the slider. Air cleaners are disposed at suitable intervals in the traveling path to clean the air therein and to discharge the cleaned air to the exterior. The traveling path accommodates a drive source, a drive mechanism, and a power supply.

11 Claims, 14 Drawing Sheets

WORK CONVEYING SYSTEM AND TRAVELING PATH SEALING STRUCTURE IN THE WORK CONVEYING SYSTEM

BACKGROUND OF THE INVENTION

1. Field of the Invention

The present invention relates to a work conveying system and a traveling path sealing structure therefor. In particular, the present invention is concerned with an improvement in a work conveying system and a traveling path sealing structure wherein, in a production line installed within a clean room for the production of, for example, semiconductor components, liquid crystal display panels, medical supplies, drugs, or processed foods, dust generated in the interior of a traveling path (guide rail) in the work conveying system is prevented from leaking out into the clean room, and the work conveying system is adapted to convey a workpiece to each of plural processing stations.

2. Description of the Prior Art

In a semiconductor integrated circuit or a liquid crystal display panel, the deposition of dust causes a lowering of product yield. In the case of medical supplies, drugs and processed foods, it is desirable to produce them in a sterile and sanitary environment. In this connection, intra-clean room production lines are utilized in a wide variety of fields, and various technical developments have been made with respect to various processing chambers and work conveying systems installed within clean rooms.

An overhead traveling type work conveying system which is one type of work conveying system has been developed. According to this work conveying system, the mode of layout of various process devices to be installed within a clean room is not restricted and it is possible to select an optimum layout, that is, it is possible to utilize the interior of the clean room effectively and it is thereby possible to reduce the equipment cost and operation cost of the clean room. The adoption of such an optimal layout is also advantageous in that the work conveying system which can be a source of dust (particles) can be kept separate from apparatuses such as the various processing chambers installed within the clean room.

The present applicant previously invented a work conveying system provided with moving means capable of moving a work holding means arbitrarily in three dimensions in the upper ceiling space within the clean room (see Japanese Patent Laid Open No. 2000-243808).

In applicant's previous work conveying system, a pair of horizontal fixed guide rails are laid in parallel within a ceiling space and one or plural horizontal traveling guide rails extend between the pair of fixed guide rails and are adapted to travel along the fixed guide rails. On each traveling guide rail is provided a traveling block which can travel along the traveling guide rail. The horizontal moving means includes the fixed guide rails, traveling guide rail(s), and a traveling block. Further, the traveling block is provided with a vertical moving means for moving the work holding means up and down. The three-dimensional moving means is the combination of the horizontal moving means and the vertical moving means.

The fixed and traveling guide rails, which are each in the form of an elongated duct, contain a drive (including a drive motor and a drive mechanism) for the traveling guide rail and the traveling block, also contain a power supply means, and are in communication with each other. Dust (particles) generated from the drive portion and the various slide connections is confined in the ducts which constitute the fixed and traveling guide rails and is evacuated from one end of a communication path and discharged to the exterior of the clean room. In this way contamination of the clean room caused by dust from within the ducts which constitute the guide rails is prevented to a considerable extent.

While the dust present within the ducts is evacuated from one end of the communication path and is discharged to the exterior of the clean room, there is the danger that the dust may leak into the clean room from an elongated gap in the duct, where the drive portion thereof extends through the duct or where a connecting member, for connection between the traveling block and the drive portion, extends through the duct.

FIG. 17 illustrates a sealing structure in this work conveying system, which closes an elongated gap 028 formed to allow for a connecting member 022 which connects a traveling guide rail 015 with a drive section (including a drive motor 023 and a drive roller 026) and extends through a duct 017 from a fixed guide rail 014. In this sealing structure, the connecting member 022 has a zigzag-bent sectional shape and shield plates 041a and 041b are inserted deep into slits 022a and 022b of the connecting member 022, thereby forming a labyrinth to prevent dust generated in the drive and slide portions in the duct from leaking out into the clean room. However, even with such a labyrinth structure, since the dust is evacuated through a long path, it has so far been impossible to completely prevent the dust present in the duct from leaking out into the clean room.

Other examples of overhead traveling type work conveying systems are disclosed in Japanese Patent Laid Open Nos. 1993-116885, 1993-39030, and 1995-291123. In these work conveying systems, a roller provided in a traveling body is adapted to roll on a rail laid on the ceiling. But the drive for the traveling roller is covered with a cover member attached to the traveling body itself, so that dust generated in the drive and in a slide connection between the traveling roller and the rail is released into the clean room. Since the above-described conventional apparatus is not dedicated to a clean room, it is not applicable to a clean room for which a high degree of cleanliness is required.

SUMMARY OF THE INVENTION

It is an object of the present invention to solve the above-mentioned problems of the conventional overhead traveling type work conveying system and to provide a work conveying system and a traveling path sealing structure in the work conveying system which can prevent dust generated by a drive mechanism and various slide connections from leaking out into a clean room, the work conveying system comprising fixed guide rails and a traveling guide rail(s), and to thereby prevent a lowering in the degree of cleanliness of the clean room more effectively.

For achieving the above-mentioned object, in a first aspect of the present invention there is provided a work conveying system comprising a least a work holding means for holding a workpiece and a horizontal moving means for moving the work holding means horizontally in an upper ceiling space within a clean room, the workpiece being conveyed to each of plural processing apparatuses, wherein the horizontal moving means has at least one linear moving mechanism, the linear moving mechanism comprising a traveling path covered with a duct and having a guide in the interior of the duct, a traveling body adapted to engage the guide and travel through the interior of the duct, and a slider located on the exterior of the duct and connected to the traveling body for travel together with the traveling body. The work holding means or another linear moving mechanism is attached to the slider, and cleaning means are disposed at suitable intervals along the traveling path to clean the air present within the duct and to discharge the cleaned air to the exterior.

Since the traveling body, which is one component of the linear moving mechanism provided in the horizontal moving means, is adapted to engage the guide located within the duct and to travel along the traveling path therein, dust generated from a slide connection by which the traveling body and the guide are engaged with each other, is confined within the duct and the possibility of its leaking out into the clean room is decreased. Since cleaning means for cleaning air within the duct and discharging it to the exterior are disposed at suitable intervals along the traveling path, dust laden air is evacuated from the duct, cleaned in a unit serving a relatively short traveling path, and the cleaned air is discharged to the exterior. Thus, it is possible to greatly decrease the amount of dust leaking out into the clean room. Consequently, it becomes possible to keep a high degree of cleanliness in the clean room.

In a second aspect of the present invention there is provided, in combination with the above first aspect, a work conveying system wherein a drive source, a drive mechanism, and a power supply means, for driving the traveling body, are accommodated in the interior of the duct, wherein at least the drive source is integral with the traveling body, whereby the possibility of dust generated by the drive portion leaking out into the clean room is decreased. As a result, it becomes possible to keep a higher the degree of cleanliness in the clean room.

In a third aspect of the present invention there is provided, in combination with the above first or second aspect, a work conveying system wherein a base member serving as a base of a guide member constitutes a part of the duct, the guide member and the base member being integrally formed by molding of the same material. In this manner, the guide and the base member which constitute a part of the duct can be fabricated at a low cost, for example, by drawing aluminum.

Further, in a fourth aspect of the present invention there is provided, in combination with any of the above first to third aspects, a work conveying system wherein the horizontal moving means includes a plurality of linear moving mechanisms in combination to permit the horizontal moving means to move arbitrarily in a horizontal plane in the upper ceiling space within the clean room. In this construction, fixed guide rails, each provided with an individual linear moving mechanism, are disposed horizontally in parallel, a traveling guide rail provided with an individual linear moving mechanism is laid between the fixed guide rails so that it can travel along the fixed guide rails, and a traveling block adapted to hold the workpiece is attached to the linear moving mechanism provided in the traveling guide rail so that the traveling block can travel along the traveling guide rail. Thus, a horizontal moving means capable of moving arbitrarily in a horizontal plane in the ceiling space can be constructed in a simple manner.

In a fifth aspect of the present invention there is provided, in combination with any of the above first to fourth aspects; a work conveying system wherein the work holding means is attached to the slider through a vertical moving means for moving the work holding means vertically. This construction provides the work conveying system with a three-dimensional moving means which permits arbitrary movement of the work holding means in a space within the clean room in an extremely simple manner.

In a sixth aspect of the present invention there is provided a work conveying system comprising at least a workpiece holding means for holding a workpiece and a horizontal moving means for moving the work holding means horizontally in an upper ceiling space within a clean room, the workpiece being conveyed to each of plural processing stations, wherein the horizontal moving means has at least one linear moving mechanism, the linear moving mechanism comprising a traveling path defined within a duct and having a guide in the interior of the duct, a traveling body adapted to engage the guide and to travel along the traveling path, and a slider on the exterior of the duct, connected to the traveling body, and adapted to travel together with the traveling body. The work holding means or another linear moving mechanism is attached to the slider. A deformable sealing means is provided in an elongated gap through which extends a connecting member for connecting the slider to the traveling body, the sealing means covering the elongated gap portion without obstructing the travel of the connecting member. Since the traveling body, as one component of the linear moving mechanism provided in the horizontal moving means of the work conveying system, is adapted to engage the guide located within the duct and to travel along the traveling path, dust generated from a slide connection between the traveling body and the guide is confined within the duct and the possibility of its leaking out into the clean room is decreased. Besides, since a deformable sealing means is provided in an elongated gap through which the connecting member extends, the amount of dust leaking out from the elongated gap into the clean room can be greatly decreased. Consequently, it becomes possible to keep a high degree of cleanliness in the clean room.

Further, in a seventh aspect of the present invention there is provided a traveling path sealing structure in a work conveying system, the work conveying system including at least one linear moving mechanism, the linear moving mechanism comprising a traveling path defined within a duct and having a guide in the interior thereof, a traveling body which engages the guide and travels along the traveling path, and a slider exterior to the duct, connected to the traveling body, and adapted to travel together with the traveling body. The work holding means or another linear moving mechanism is attached to the slider. A deformable sealing means is provided in an elongated gap, through which extends a connecting member for connecting the slider to the traveling body, the sealing means covering the elongated gap portion without obstructing the travel of the connecting member. Since the traveling body as one component of the linear moving mechanism provided in the work conveying system is adapted to engage the guide located within the duct and to travel along the traveling path, dust generated by a slide connection between the traveling body and the guide is confined within the duct and the possibility of its leaking out into the clean room is decreased. Besides, since a deformable sealing member is provided in an elongated gap, through which the connecting member extends, it is possible to greatly decrease the amount of dust leaking out through the elongated gap. Consequently, a high degree of cleanliness of the external environment can be maintained.

In an eighth aspect of the present invention there is provided, in combination with the above seventh aspect, a traveling path sealing structure in a work conveying system wherein the sealing means is an expansion member in the shape of bellows which normally extends naturally to seal the elongated gap. According to this construction, by merely providing in the elongated gap portion a bellows-like expansion member which is commonly used as a sealing member or a protective cover member, there can be easily obtained a deformable sealing means which covers the elongated gap without obstructing the travel of the connecting member.

In a ninth aspect of the present invention there is provided, in combination with the above seventh aspect, a traveling path sealing structure in a work conveying system wherein the sealing member is an expansion member which is normally extended by magnetism to seal the elongated gap. According to this construction, by magnetizing a lower edge which extends along the elongated gap and by attracting the lower edge magnetically, the expansion member is extended to cover the elongated gap. Consequently, in the areas other than where the connecting member is located, the sealing of the elongated gap portion is ensured, with no obstruction to smooth travel of the connecting member.

Further, in a tenth aspect of the present invention, there is provided, in combination with the above eighth or ninth aspect, a traveling path sealing structure in a work conveying system wherein, when looking in the traveling direction of the connecting member, in front of the connecting member are provided a first seal holding member for holding the sealing means in an initially closed state and a first seal opening member for subsequently opening the sealing member in advance of the connecting member as it travels through the elongated gap, and at the rear of the connecting member are provided a second seal opening member for holding the sealing means in an initially opened state and a second seal holding member for subsequently closing the sealing member as the connecting member travels through the elongated gap. According to this construction, closure of the elongated gap by the sealing means other than where the connecting member is located and release (opening) of the closure of the elongated gap by the sealing means where the connecting member passes are performed forcibly, so that both positive sealing of the elongated gap and smooth travel of the connecting member can be effected simultaneously.

In an eleventh aspect of the present invention there is provided, in combination with the above seventh aspect, a traveling path sealing structure in a work conveying system wherein the sealing means is a chain which normally hangs down to seal the elongated gap. By providing a chain in the elongated gap, it is possible to easily obtain a deformable sealing means which covers the elongated gap without obstructing the travel of the connecting member.

In a twelfth aspect of the present invention there is provided, in combination with the above seventh aspect, a traveling path sealing structure in a work conveying system wherein the sealing means comprises a pair of upper and lower elastic tubular members which constantly press the connecting member from above and below, and as the connecting member travels along the elongated gap it pushes apart the pair of upper and lower elastic tubular members vertically, while, after passage of the connecting member, the pair of upper and lower elastic tubular members can immediately revert to their original shape. According to this construction, by providing the elongated gap with a pair of upper and lower elastic tubular members having a bellows shape or a balloon shape in section, there is easily obtained a deformable sealing means which covers the elongated gap without obstructing the travel of the connecting member.

DETAILED DESCRIPTION OF PREFERRED EMBODIMENTS

An embodiment (first embodiment) of the invention will be described with reference to FIGS. 1 to 3.

Figure 1:
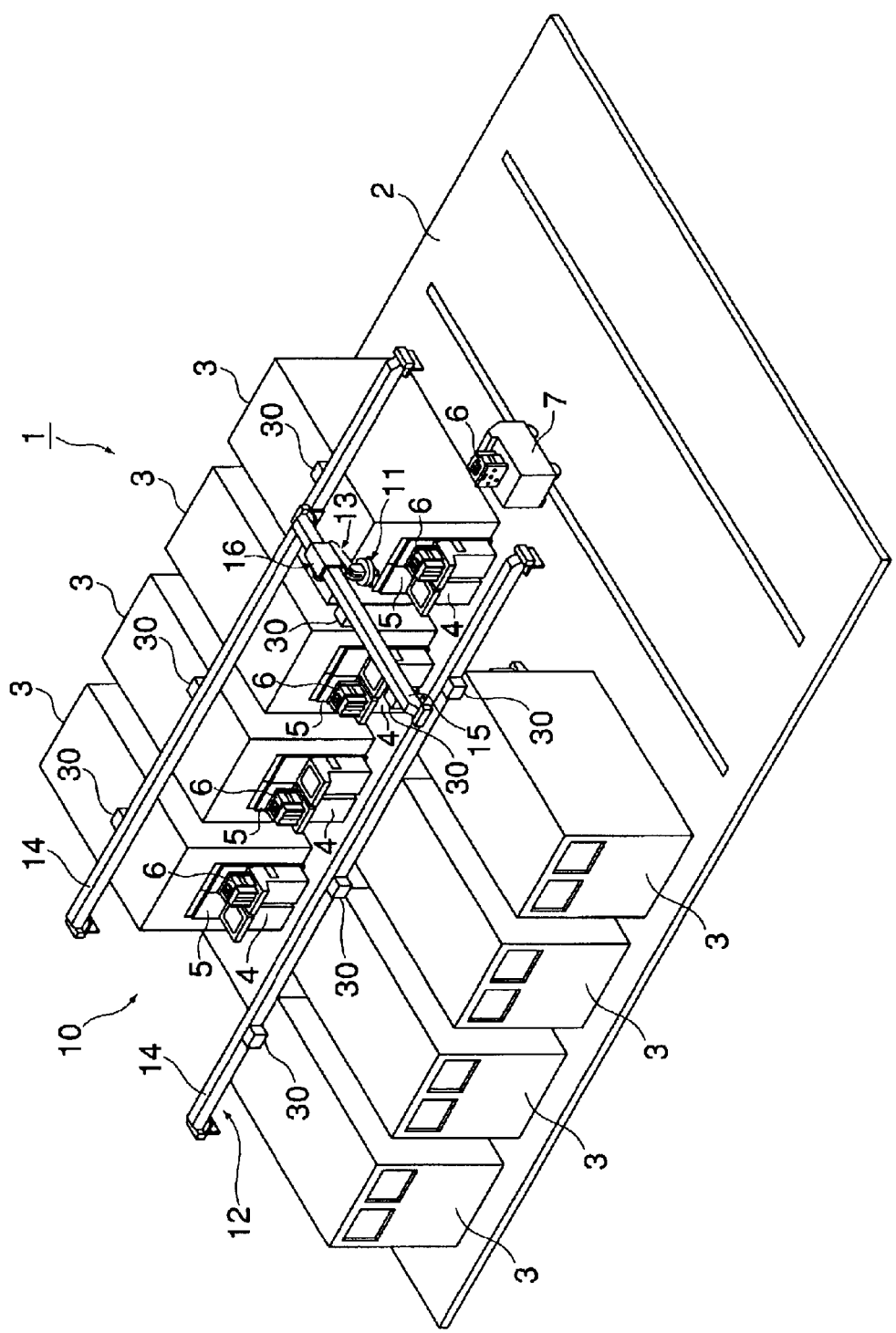
FIG. 1 is a perspective view of a production line in a clean room to which is applied a work conveying system according to a first embodiment of the invention.

In a production line 1 installed within a clean room to which the work conveying system of the first embodiment is applied, as shown in FIG. 1, plural processing chambers (processing apparatuses) 3 are arranged side by side in two rows on a floor surface 2 in the clean room, and an interface device 4 is attached to a front end of each processing chamber 3.

The processing chambers 3 are apparatuses for conducting different processings for workpieces, one after another. Taking tact time balance in work processing into account, a plurality of the same processing chambers may be included in the production line. For example, the processing chambers 3 may be semiconductor wafer processing chambers for subjecting a semiconductor wafer to such processes as the application of resist, exposure, development, ion implantation, annealing, and sputtering. With such steps in processing of a semiconductor wafer in mind, the following description is now provided. The interface device 4 associated with each semiconductor wafer processing chamber is a device called a FOUP opener.

The interface devices 4 constitute buffer spaces for isolating the processing chambers 3 and the clean room from each other. The delivery of workpieces to each processing chamber 3 is performed through the associated interface device 4. A work inlet/outlet 5 in each interface device 4 is hermetically sealed except when loading and unloading a workpiece.

Adjacent processing chambers 3 and interface devices 4 are arranged in a minimum maintenance area, required for maintenance and operating personnel. Thus, the floor area of the clean room is minimized to make the most of the clean room and to allow an efficient conveyance of workpieces by the work conveying system 10 to be described later. But it is not always necessary that the processing chambers 3 be arranged in plural rows, nor is the direction a front side (the side where each interface device 4 is provided) should face limited. A certain degree of random arrangement is allowed.

In an upper space within the clean room is installed the work conveying system 10 for conveying a hermetically sealed container (FOUP) 6 to the processing chambers 3. Workpieces are conveyed in a hermetically sealed state within the hermetically sealed container 6 in order to keep the high degree of cleanliness required. The floor surface 2 provides a space for the travel of work carriers 7. When a work carrier 7 receives the hermetically sealed container 6, which has been conveyed from outside the clean room, the work carrier 7 travels to a predetermined position along a rail, and delivers the container 6 to the work conveying system 10.

The work conveying system 10 is provided with work holding means 11 for holding the hermetically sealed container 6, horizontal moving means 12 for moving the work holding means 11 horizontally in the upper ceiling space within the clean room, and vertical moving means 13 in the form of an articulated arm carried by the horizontal moving means 12. As noted earlier, the work conveying system 10 conveys workpieces (the hermetically sealed container 6) to each processing chamber 3 and moves among plural processing chambers in a predetermined sequence. The articulated arm of the vertical moving means 13 is extended and contracted to raise and lower the work holding means 11, thereby making it possible to transport workpieces between the work holding means 11 and each of the processing chambers 3. A three-dimensional moving mechanism is formed by the combination of horizontal moving means 12 and vertical moving means 13.

As shown in FIG. 1, the horizontal moving means 12 comprises a pair of horizontal fixed guide rails 14 which are laid in parallel in the upper ceiling space within the clean room, a traveling guide rail 15 laid between the pair of fixed guide rails 14, and a traveling block 16 disposed on the traveling guide rail 15 and adapted to travel along the traveling guide rail 15. The traveling guide rail 15 travels along the pair of fixed guide rails 14 and traveling block 16 travels along the traveling guide rail 15. Thus, in the upper ceiling space within the clean room, the horizontal moving means 12 can move arbitrarily in a horizontal plane sandwiched in between the pair of fixed guide rails 14. Consequently, the vertical moving means 13 and the work holding means 11 can be moved linearly from one position to another position located on the opposite side. Actually, the vertical moving means 13 is incorporated into the horizontal moving means 12 by attachment to the traveling block 16. A suitable spacing between the pair of horizontal fixed guide rails 14 is set in accordance with the arrangement of the processing chambers 3 (installed position and direction). The spacing may be the full width of the clean room.

Next, the structure of a linear moving mechanism provided in the horizontal moving means 12 for moving the traveling guide rail 15 along the fixed guide rails 14 and a linear moving mechanism for moving the traveling block 16 along the traveling guide rail 15 will be described. Since both linear moving mechanisms share a common structure, only the linear moving mechanism for moving the traveling guide rail 15 along the pair of fixed guide rails 14 will be described in detail.

Figure 2:
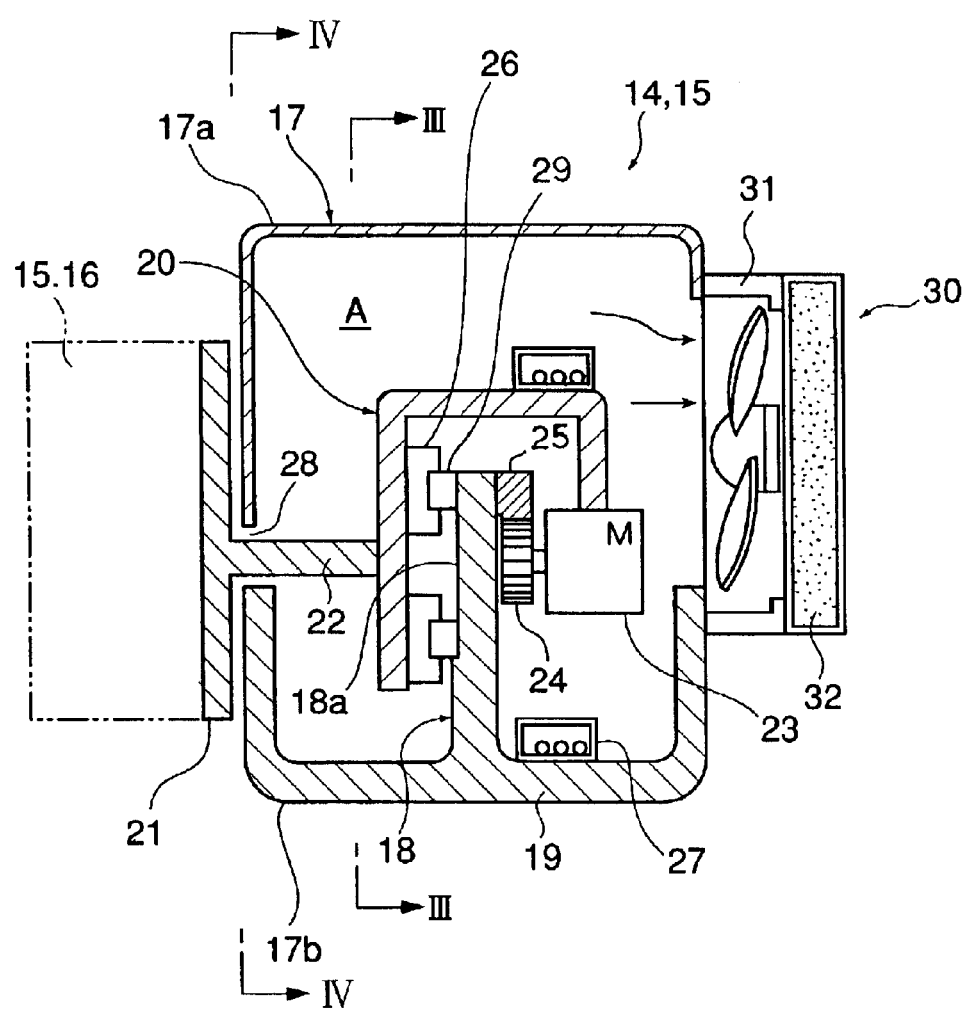
FIG. 2 is a cross sectional view of a linear moving mechanism provided in a horizontal moving means used in the work conveying system.
Figure 3:
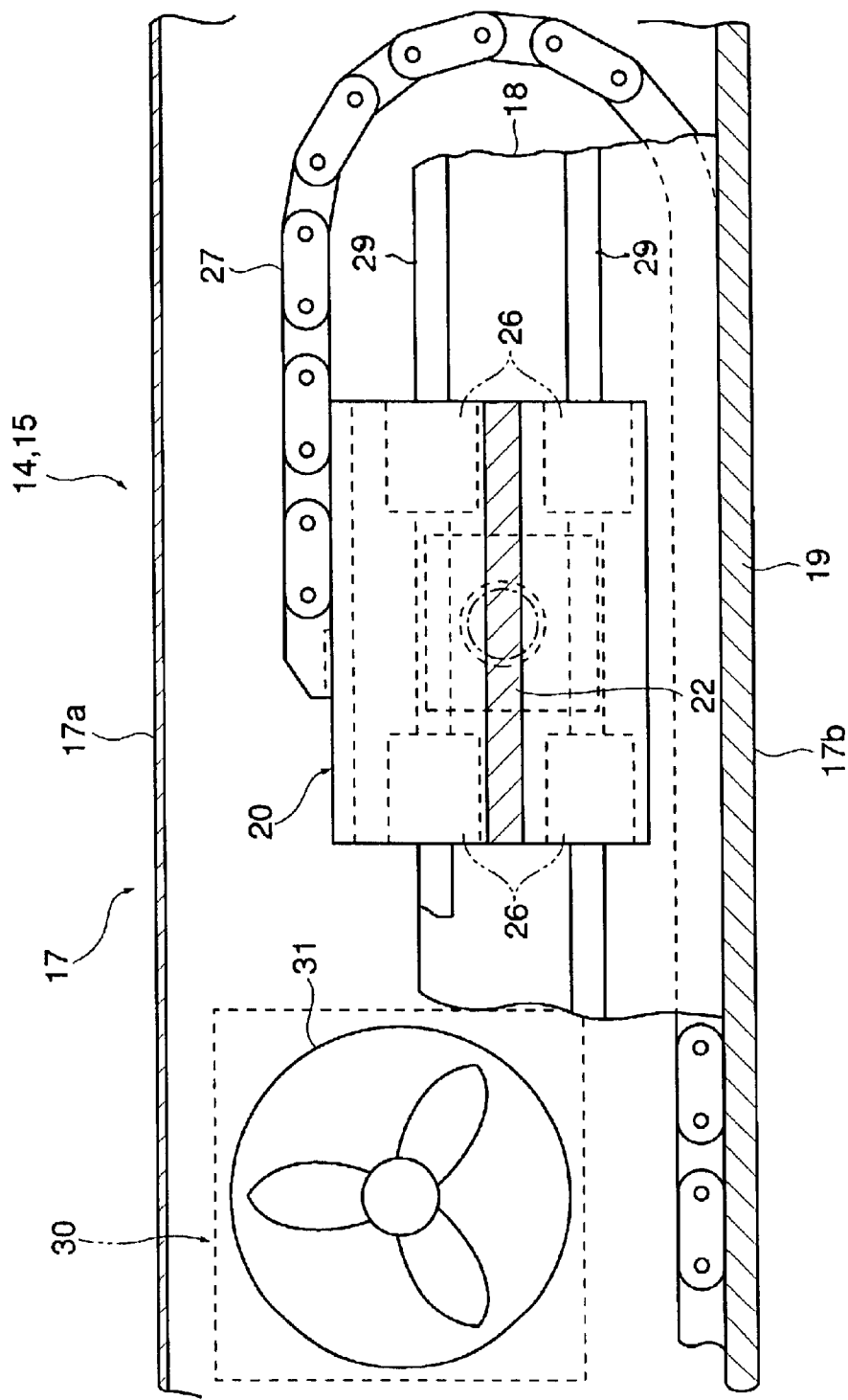
FIG. 3 is a sectional view as seen in the direction of arrows, taken along line III—III in FIG. 2.

In the linear moving mechanism for moving the traveling guide rail 15 along the pair of fixed guide rails 14, as shown in FIGS. 2 and 3, a traveling body 20 engages and travels along a guide 18a provided near the center of the interior (traveling path A) of a duct 17 which constitutes an outer shell of each of the fixed guide rails 14. Further, a slider 21 is connected to the traveling body 20 through a connecting member 22 and the traveling guide rail 15 is mounted on the slider 21. As the traveling body 20 travels along the guide 18a, the traveling guide rail 15 travels along the pair of fixed guide rails 14 together with the traveling body 20 through the connecting member 22 and the slider 21. The linear moving mechanism moves the traveling block 16 along the traveling guide rail 15, with the traveling block 16 attached to the slider 21. For diminishing stress imposed on the connecting member 22, the guide 18a may be positioned close to elongated gap 28 to be described later.

The duct 17 is constituted by an integral connection of an upper duct half 17a and a base member 19 or lower duct half 17b. The duct 17 defines a traveling path A for the traveling body 20 which determines a track of the traveling guide rail 15.

The lower duct half 17b is relatively thick-walled and is formed in a chevron-like sectional shape as a whole in which a guide member 18 having the guide 18a is erected on the base member 19 at a transversely central position. The guide 18a corresponds to the upper half portion of the guide member 18. Travel of the traveling body 20 is guided through linear bushings 26 and linear guide rails 29 which will be described later. The base member 19 constitutes a base of the guide member 18. The lower duct half 17b is integrally formed of drawn aluminum.

The upper duct half 17a is relatively thin-walled and covers the lower duct half 17b. The upper and lower duct halves cover the traveling path A and form a substantially hermetically sealed duct 17. The upper duct half 17a is formed of a thin metallic or synthetic resin plate and is removably attached to the lower duct half 17b to facilitate maintenance.

The interior of the traveling path A accommodates a motor 23 as a drive source for driving the traveling body 20, a drive mechanism for the traveling body, and a movable cable 27 as a power supply means, wherein the motor 23 is integral with the traveling body 20.

As shown in FIGS. 2 and 3, the traveling body 20 is constituted by a relatively thick-walled, rigid member having a J-shaped section. Linear bushings 26 are fixed at a total of four upper, lower and right, left positions to an inner surface of a long leg-side wall of the J-shaped section. The motor 23 is fixed to a lower end of a short leg-side wall of the J-shaped section and a pinion 24 is connected to an output shaft of the motor 23. A rack 25 is in mesh with the pinion 24, the rack 25 being fixed to the wall of the guide 18a opposite the side where a pair of linear guide rails 29 are fixed. The linear bushings 26 and the linear guide rails 29 are engaged with each other. Therefore, when the motor 23 operates, the pinion 24 drives the rack 25 to move the traveling body 20 linearly along the linear guide rails 29 relative to the guide 18a. The pinion 24 and the rack 25 constitute a drive mechanism for the traveling body 20, and the motor 23, pinion 24, and rack 25, as a whole, constitute a drive portion for the traveling body 20.

One end of the connecting member 22, which is a relatively thick-walled, rigid plate member, is fixed to an outer surface (opposite the side carrying the linear bushings 26 of the long leg of the J section of the traveling body 20 in the longitudinal direction of the traveling body 20. The connecting member 22 extends outside of the duct 17 through the elongated gap 28 formed on one side of the duct and the slider 21 is integrally connected and fixed to the exterior end of the connecting member. As noted above, the traveling guide rail 15 or the traveling block 16 is fixed to the slider 21. On one side of the duct 17, mating surfaces of the upper duct half 17a and the lower duct half 17b are opposed to each other across a spacing which permits the connecting member 22 to pass therethrough, whereby the elongated gap 28 is defined.

One end of the movable cable 27 serving as a power supply means is fixed to the bottom of the duct 17, while the opposite end thereof is fixed to an outer surface of an upper wall of the traveling body 20, and at an intermediate position between the opposite ends the movable cable 27 is bent in a U shape. As the traveling body 20 travels, the movable cable 27 advances and retreats its bent position to supply the motor 23 with electric power fed from the source in the factory. Though not shown in detail, this electric power feed is branched to feed the drive motor for the linear moving mechanism provided in the traveling guide rail 15 and fixed to the slider 21 and to feed the drive motor in the vertical moving means suspended from the traveling block 16. Alternatively, electric power may be fed through a power transmission line laid along the traveling path A, instead of the movable cable 27.

As shown in FIG. 2, the drive portion of the traveling body 20 and the portion of the traveling body 20 which slides on the guide portion 18a, as it travels, are centrally located in the duct 17 which substantially surrounds the traveling body 20 and a casing of the motor 23. Thus, those portions are spaced a distance from and separated by a wall from the elongated gap 28, so that dust generated by the traveling body 20 is impeded from leaking out into the clean room through the elongated gap 28.

On the side of the duct 17, opposite the slider 21, are disposed plural cleaning means 30 which, as shown in FIG. 2., are each made up of a fan 31 and a filter 32, and are arranged at suitable intervals along the length of the duct 17, in a number according to the length of the duct and according to the capacity of the fan 31. Each cleaning means 30 cleans dust (particles)-containing air present within the traveling path A and discharges the cleaned air into the exterior clean room, whereby the cleanliness in the clean room is maintained to a high degree.

The horizontal moving means 12, for which three sets of the above linear moving mechanisms are used in combination, is formed as a two-dimensional moving mechanism comprising the pair of horizontal fixed guide rails 14, the traveling guide rail 15 laid between the pair of fixed guide rails 14, and the traveling block 16 disposed on the traveling guide rail 15 and adapted to travel along the traveling guide rail 15. This two-dimensional moving mechanism is movable arbitrarily in a horizontal plane in the upper ceiling space within the clean room. The number of the linear moving mechanisms is determined as necessary. For example, if another traveling guide rail 15 is laid between the pair of fixed guide rails 14 and another traveling block 16 is mounted on the traveling guide rail 15, another three sets of linear moving mechanisms are used in combination.

This first embodiment, constructed as described above, produces the following effects.

Since the traveling body 20, as one part of each linear moving mechanism provided in the horizontal moving means 12, is adapted to engage the guide 18a located within the traveling path A defined within the duct 17 and to travel along path A, dust generated by the sliding of the traveling body 20 on the guide 18a is confined within the duct 17 and the possibility of its leaking out into the exterior clean room is diminished. Moreover, since the motor 23 which serves to drive the traveling body 20 is integral with the traveling body 20, the drive portion (including the drive motor 23, pinion 24 and rack 25) of the traveling body 20 is also within the traveling path A and hence the possibility that dust generated by the drive portion may leak out into the clean room is also diminished. In the traveling path A, moreover, since cleaning means 30, for cleaning air in the traveling path A and discharging cleaned air to the exterior, are disposed at suitable intervals, dust present in the traveling path A over a relatively short length is removed and is discharged into the exterior clean room, whereby the amount of dust leaking out into the clean room can be greatly diminished. Consequently, it becomes possible to maintain the cleanliness in the clean room to a high degree.

Additionally, since the traveling body 20, the guide 18a and the drive of the traveling body 20 are positioned nearly centrally in the interior of the duct 17, that is, positioned relatively far from the elongated gap 28 through which the connecting member 22 extends to connect the slider 21 to the traveling body 20, the possibility that dust generated within traveling path A may be discharged into the clean room through the elongated gap 28 is much decreased. Consequently, the interior of the clean room can be kept at a still higher degree of cleanliness.

The base member 19 serving as a base for the guide member 18, integral with the guide 18a, constitutes the lower half 17b of the duct 17. The guide member 18 and base member 19 are integrally formed by drawing the same piece of aluminum material and therefore can be fabricated at a low cost.

Plural sets of linear moving mechanisms are used in combination to permit arbitrary movement of the horizontal moving means 12 in a horizontal plane in the upper ceiling space within the clean room.

Further, since the work holding means 11 is attached to the traveling block 16 through the vertical moving means 13 and since the traveling block 16 is mounted on the slider 21, the work conveying system 10 is provided with a three-dimensional moving means which permits arbitrary movement of the work holding means 11 within the clean room in an extremely simple manner.

Next, a second embodiment of the invention will be described with reference to FIGS. 4 to 8.

In comparison with the linear moving mechanism provided in the horizontal moving means 12 in the work conveying system 10 of the first embodiment, the linear moving mechanism provided in the work conveying system 10 of this second embodiment or, more specifically, in the horizontal moving means 12 used therein, differs only in the structure of elongated gap 28 and in that of a connecting member 22. While cleaning devices 30 are optional, for completely solving the problem of dust in the clean room provision of the cleaning means 30 is desirable. The work conveying system 10 of this second embodiment or the horizontal moving means 12 used therein is provided with at least one linear moving mechanism. For example, plural linear moving mechanisms may be used in combination as a horizontal moving means 12, for arbitrary movement in a horizontal plane. In the case where a single linear moving mechanism constitutes the horizontal moving means, the horizontal moving means can move only along one horizontal line. Likewise, where a single linear moving mechanism constitutes a vertical moving means, it can move on only one vertical line.

In the linear moving mechanism of this second embodiment, in the elongated gap 28 through which the connecting member 22 extends and travels along the traveling path A, there is disposed deformable sealing means 40 which covers the elongated gap 28 without obstructing the travel of the connecting member 22. The sealing means 40 also plays the role of minimizing the opening of the elongated gap 28 in order to enhance the dust vacuuming effect of the fans 31 in the cleaning means 30.

Figure 4:
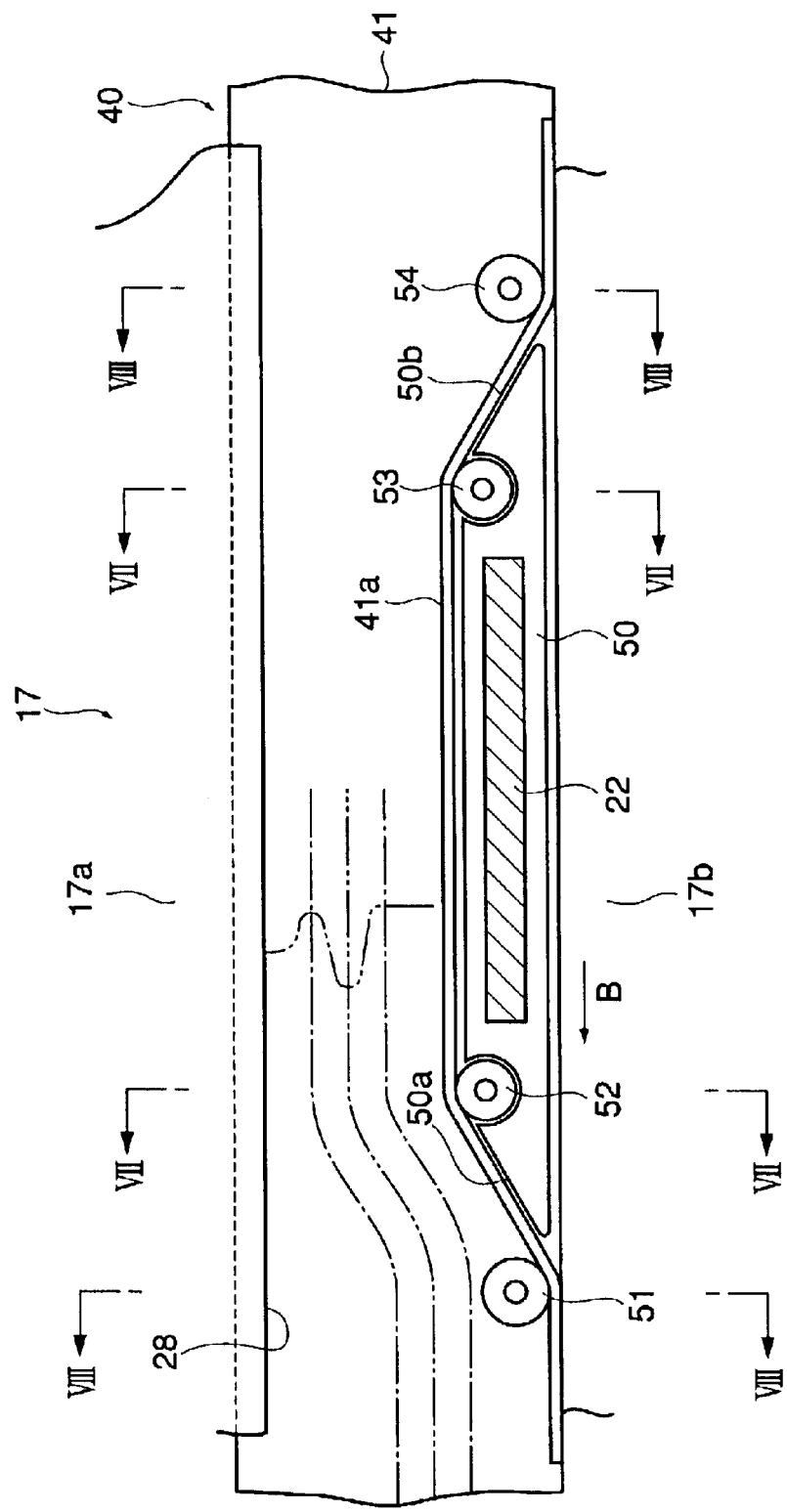
FIG. 4 is a partial sectional side view of a linear moving mechanism provided in a work conveying system according to a second embodiment of the invention, or provided in a horizontal moving means used in the work conveying system, as cut at a position corresponding to line IV—IV in FIG. 2.
Figure 7:
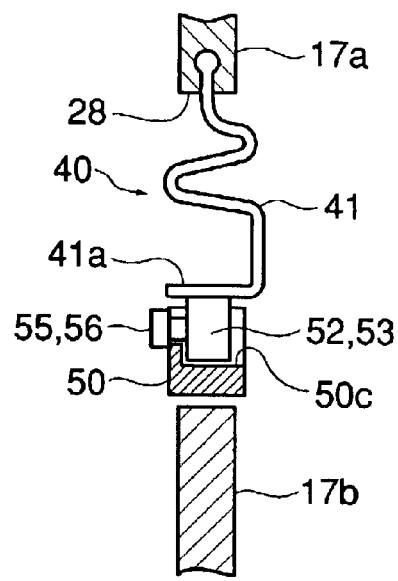
FIG. 7 is a sectional view as seen in the arrowed direction, taken along line VII—VII in FIG. 4.
Figure 8:
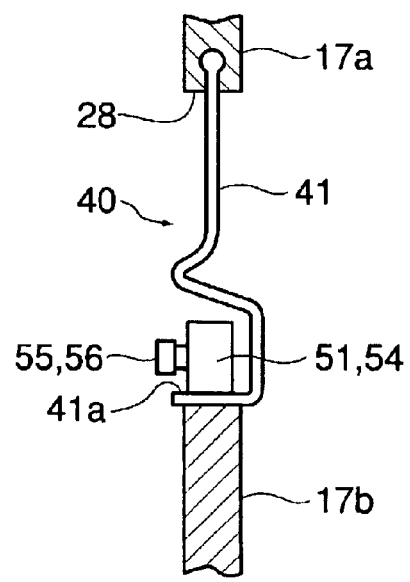
FIG. 8 is a sectional view as seen in the arrowed direction, taken along line VIII—VIII in FIG. 4.

As shown in FIGS. 4, 7, and 8, the sealing means 40 corresponds to an expansion member 41 which is in a bellows shape and which is normally extended to seal the elongated gap 28. In this second embodiment, in front of the connecting member 22 as seen in the traveling direction (indicated with arrow B) of the connecting member 22 are provided a first seal holding member 51 for holding the expansion member 41 in an initially closed state and a first seal opening member 52 for subsequently opening the expansion member 41 as the connecting member 22 moves through the elongated gap 28. Further, at the rear of the connecting member 22 are provided a second seal opening member 53 for holding the expansion member 41 in an initially opened state and a second seal holding member 54 for subsequently closing the expansion member 41 as the connecting member 22 moves through the elongated gap 28.

Figure 5:
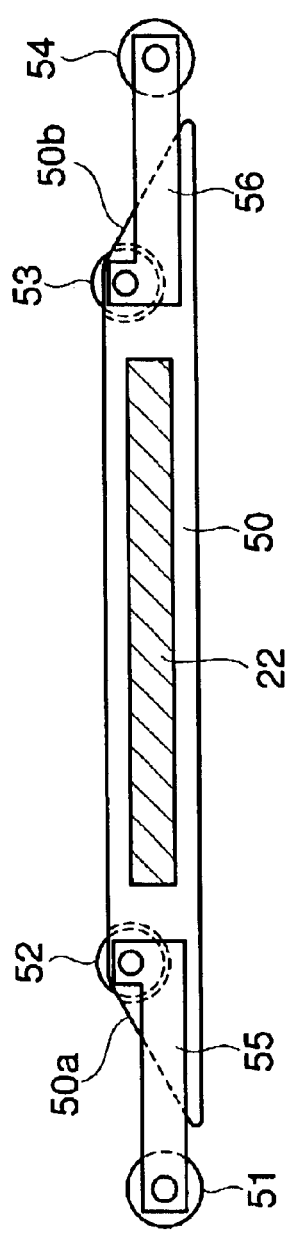
FIG. 5 is a sectional side view of a connecting member as seen in FIG. 4, and is a sectional view as seen in the arrowed direction, taken along line V—V in FIG. 6.

The first and second seal holding members 51, 54 and the first and second seal opening members 52, 53 are all rollers, which are rotatably supported at opposing ends of L-shaped roller support members 55 and 56, respectively, as shown in FIG. 5. The roller support members 55 and 56 are fixed to respective opposing ends of a travel assist member 50, whereby the rollers are fixed in position relative to the travel assist member 50 and the connecting member 22. The travel assist member 50 has an elongated shape and is of such a size as to enclose the connecting member 22 in side view and is fixed at approximately the longitudinal center of the connecting member 22. The travel assist member 50 is provided at its opposing ends with tapered portions 50a and 50b which extend outwardly downward.

Figure 6:
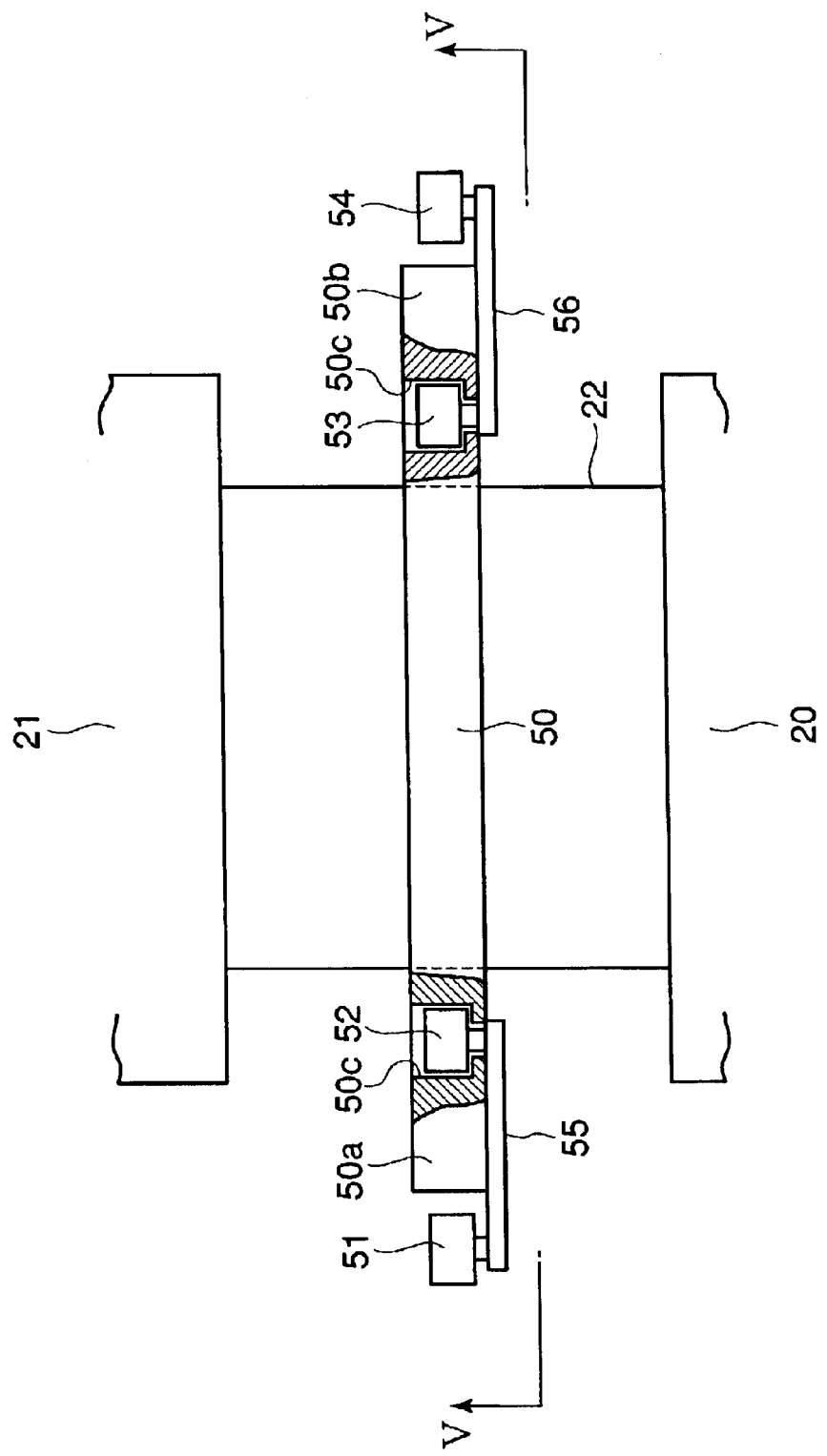
FIG. 6 is a plan view of FIG. 5, partially broken away.

The first seal holding member 51, which is located in front of the front tapered portion 50a of the travel assist member 50, presses a flat lower end portion 41a of the expansion member 41 from above to maintain a closed seal (see FIG. 8), while the first seal opening member 52, which is located at a rear shoulder portion of the front tapered portion 50a of the travel assist member 50, is mounted partially exposed while being seated in a recess 50c (see FIGS. 6 and 7). The first seal opening member 52 pushes up the flat lower-end portion 41a of the expansion member 41 from below to hold open the seal (see FIG. 7). By operation of the first seal holding member 51 and the first seal opening member 52, the travel of the connecting member 22 and that of the travel assist member 50, within the elongated gap 28, are assisted while the sealing of the elongated gap 28 is maintained.

The second seal opening member 53, which is located at a front shoulder portion of the rear tapered portion 50b of the travel assist member 50, is partially exposed and seated in a recess 50c and pushes the flat lower-end portion 41a of the expansion member 41 from below to hold open the seal (see FIG. 7). The second seal holding member 54 is located behind the rear tapered portion 50b of the travel assist member 50 and presses the flat lower-end portion 41a of the expansion member 41 from above to restore the seal to a closed state (see FIG. 8). By such operations of the second seal opening member 53 and the second seal holding member 54, the travel of the connecting member 22 and that of the travel assist member 50, within the elongated gap 28, are assisted while maintaining a positive seal of the elongated gap 28.

In the second embodiment, as in the first embodiment, the traveling body 20 is adapted to engage the guide 18a extending along the traveling path A and covered with the duct 17 and to travel along path A, so that dust generated by engagement between the traveling body 20 and the guide 18a is confined within the duct 17. Since the motor 23 serving as the drive of the traveling body 20 is integral with the traveling body 20, the drive portion (including the drive motor 23, pinion 24 and rack 25) of the traveling body 20 is also contained within the interior of the duct 17 and dust generated by the drive portion is less likely to leak out into the clean room. In this second embodiment, moreover, the deformable sealing means 40 covers the elongated gap 28 to further restrict dust from leaking out into the clean room. Consequently, it becomes possible to keep the interior of the clean room at a high degree of cleanliness.

Further, the slide connection between the traveling body 20 and the guide 18a and the drive portion of the traveling body 20 are positioned approximately centrally in the interior of the duct 17, that is, the slide portion and the drive portion are positioned relatively far from the elongated gap 28, to further decrease the possibility that the dust generated by the slide connection and by the drive portion might be discharged into the clean room through the elongated gap 28.

The sealing means 40, which is constituted as the expansion member 41 with a bellows-like shape and which is normally extended to seal the elongated gap 28, is commonly used as a sealing member or as a protective cover and is easily obtained.

Figure 9:
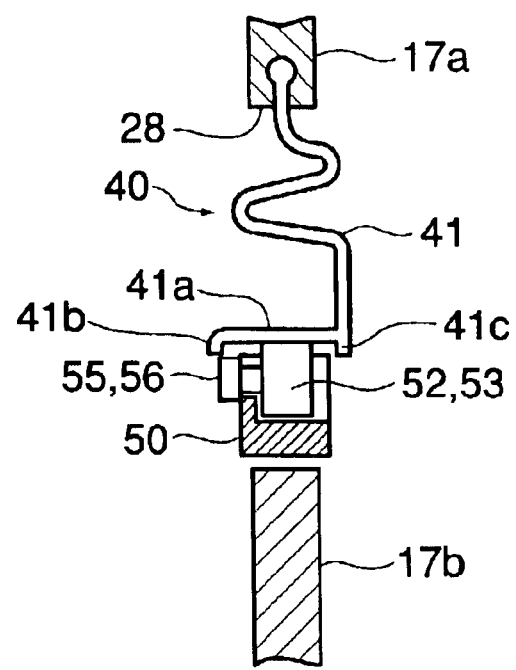
FIG. 9 is a view similar to FIG. 7, showing a modified example of a sealing means used in the work conveying system of the second embodiment.

The shape of the expansion member 41 serving as the sealing means 40 may be modified as shown in FIG. 9. In this modified example, projections 41b and 41c, having a short downward length, are formed along inner and outer side edges of the flat lower-end portion 41a of the expansion member 41. With such projections 41b and 41c, when the expansion member 41 has been extended to seal the elongated gap 28, there is no danger of the flat lower-end portion 41a of the expansion member 41 becoming disengaged from the upper edge on the elongated gap 28 side of the lower duct half 17b. Also when the flat lower-end portion 41a of the expansion member 41 is pushed up from below by the first and second seal opening members (rollers) 52 and 53, the flat lower-end portion 41a is not disengaged from the upper edges of the first and second seal opening members 52, 53 and the travel assist member 50, thus ensuring a stable seal of the elongated gap 28.

Next, a third embodiment of the invention will be described.

In the work conveying system 10 of this third embodiment, though not shown, the sealing means 40 is an expansion member which is normally extended by a magnetic force to seal the elongated gap 28. In this respect the work conveying system 10 of this third embodiment is different from that of the second embodiment, but does not differ with respect to other features and, accordingly, a detailed explanation of such other features will be omitted.

This third embodiment provides the following advantages.

By imparting magnetism to a lower edge of an expansion member which extends along the elongated gap 28, for example, to the flat lower-end portion 41a of the expansion member 41 in the second embodiment, and by biasing the lower edge magnetically, the expansion member 41 can be extended to cover the elongated gap 28, so as to positively seal that portion of the elongated gap 28 other than where the connecting member 22 is located. Moreover, there is no obstacle to smooth travel of the connecting member 22. Further, the same effects obtained in the second embodiment are attained by the third embodiment.

Next, a fourth embodiment of the invention will be described with reference to FIGS. 10 to 12.

Figure 10:
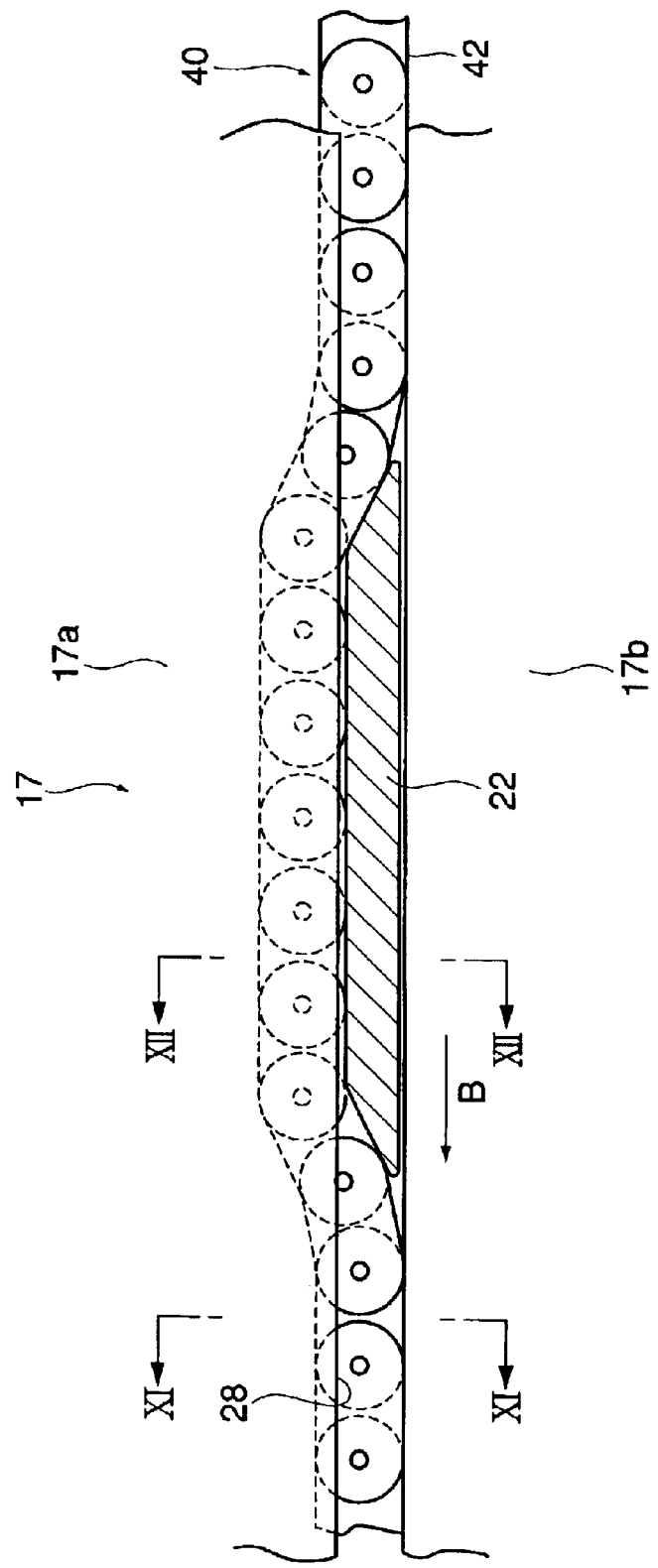
FIG. 10 is a partial sectional side view of a linear moving mechanism provided in a work conveying system according to a fourth embodiment of the invention, taken along line IV—IV in FIG. 2 and as seen in the arrowed direction.

FIG. 10 is a partial sectional side view of the linear moving mechanism of the work conveying system of the fourth embodiment, as taken along line IV—IV in FIG. 2. FIG. 11 is a sectional view taken along line XI—XI in FIG. 10, and FIG. 12 is a sectional view taken along line XII—XII in FIG. 10. Features common to the work conveying system of the second embodiment are identified by the same reference numerals as in the second embodiment.

Figure 11:
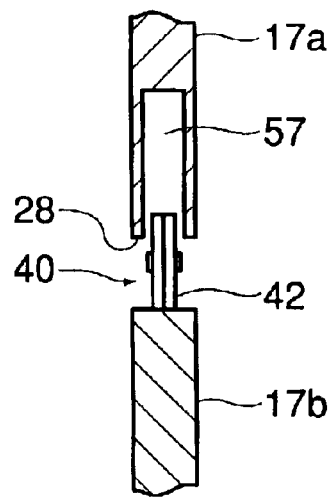
FIG. 11 is a sectional view taken along line XI—XI in FIG. 10.
Figure 12:
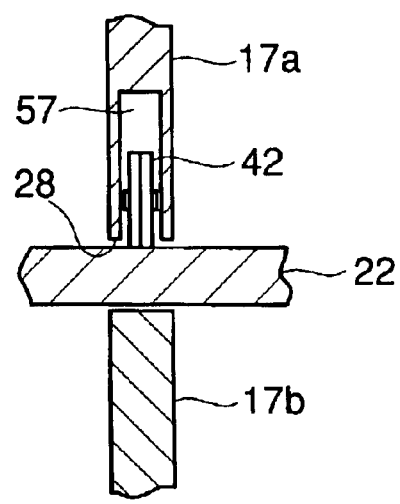
FIG. 12 is a sectional view taken along line XII—XII in FIG. 10.

In this fourth embodiment, as shown in FIGS. 10 to 12, the sealing means 40 is a chain 42, which normally hangs down naturally to seal the elongated gap 28. The first and second seal holding members 51, 54, the first and second seal opening members 52, 53, and associated components, which are used in the second embodiment, are not used in this fourth embodiment.

A groove 57 is formed in the lower edge of the upper duct half 17a, as shown in FIGS. 11 and 12. The groove 57, which allows the chain 42 to move vertically in and out, extends the entire length of the duct 17. As the connecting member 22 passes along the elongated gap 28 it pushes the chain 42 upward within and guided by the groove 57, so that the elongated gap 28 can be sealed positively without obstructing smooth travel of the connecting member 22. The work conveying system 10 of this fourth embodiment is different in the above respect from the second embodiment, but does not differ in other respects, a detailed description of which will be omitted.

Since this fourth embodiment is constructed as above, use of a chain in the elongated gap 28 provides deformable sealing means 40 which covers the elongated gap 28 without obstructing the travel of the connecting member 22. Additionally, it provides advantages like those of the second embodiment.

A fifth embodiment of the invention will now be described with reference to FIGS. 13 and 14. Features common to the work conveying system of the second embodiment are identified by the same reference numerals as in the second embodiment.

Figure 13:
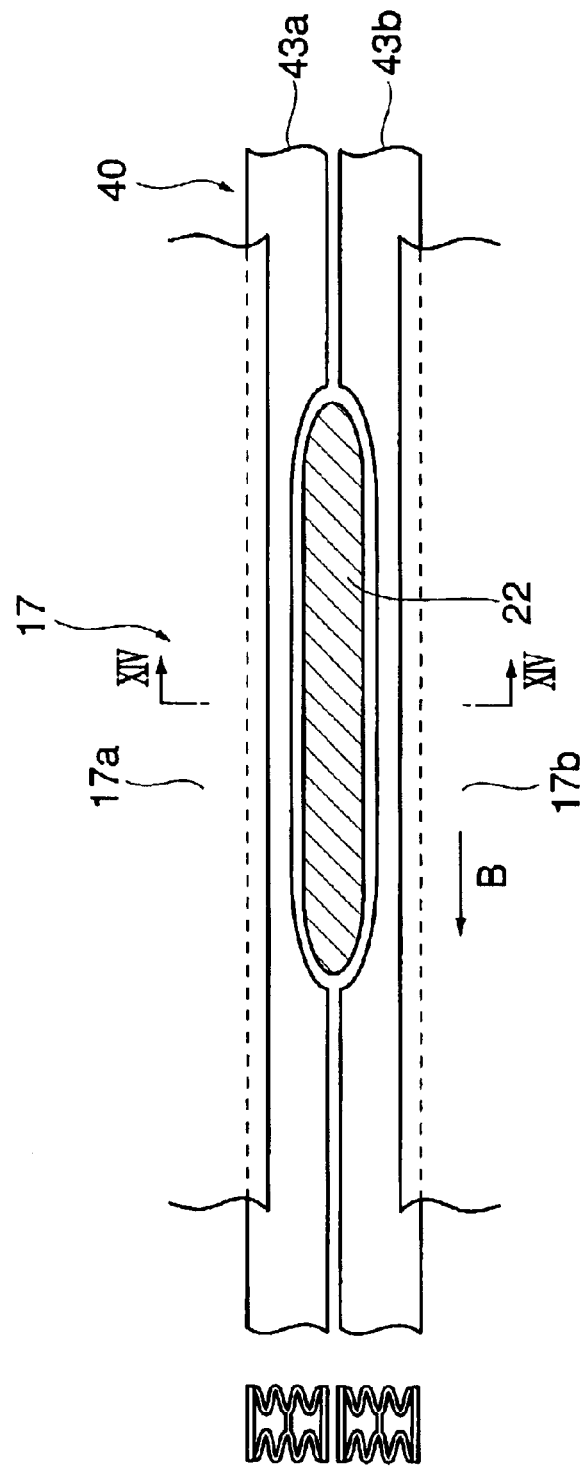
FIG. 13 is a partial sectional side view of a linear moving mechanism provided in a work conveying system according to a fifth embodiment of the invention described in the foregoing twelfth aspect, taken on line IV—IV in FIG. 2.
Figure 14:
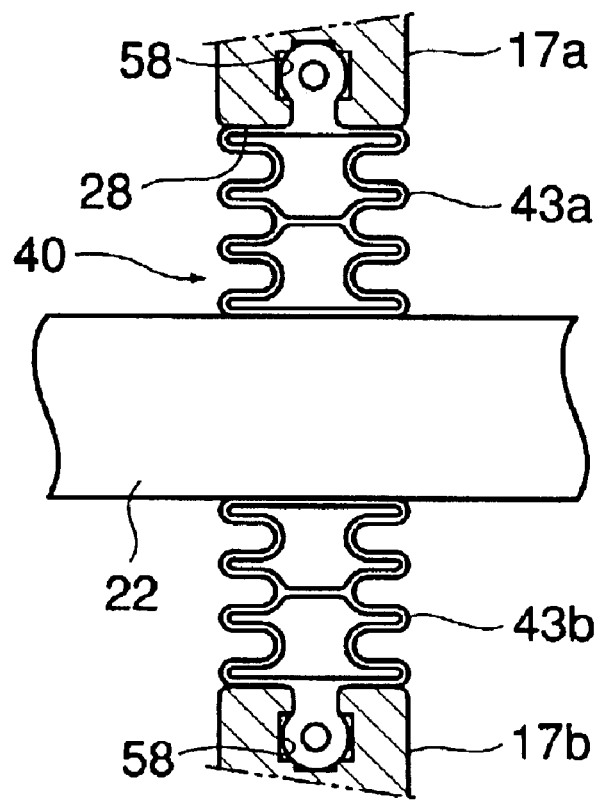
FIG. 14 is an enlarged sectional view taken along line XIV—XIV in FIG. 13.

In this fifth embodiment, as shown in FIGS. 13 and 14, the sealing means 40 comprises a pair of upper and lower elastic tubular members 43a, 43b having a bellows-like section. The pair of upper and lower elastic tubular members 43a, 43b constantly press the connecting member 22 from above and below, and, as the connecting member 22 passes along the elongated gap 28, it pushes the pair of upper and lower elastic tubular members 43a, 43b apart, upward and downward respectively (see FIG. 14). After the connecting member 22 has passed, the pair of upper and lower elastic tubular members 43a and 43b can immediately revert to their original state, biased together (see the left-hand cross sectional view in FIG. 13).

As it passes along the elongated gap 28, the outer periphery of the connecting member 22 is pressed by the elastic tubular members 43a and 43b to provide a satisfactory seal therebetween. In FIG. 13, the state where the upper and lower elastic tubular members 43a, 43b assume their original expanded state, as well as the state where the outer periphery of the connecting member 22 is pressed by the tubular members 43a and 43b, are drawn in a rough manner to facilitate understanding.

As shown in FIG. 14, upper and lower end head portions of the pair of elastic tubular members 43a and 43b are circular in section and are inserted respectively into holes 58 formed respectively in the lower edge of the upper duct half 17a and the upper edge of the lower duct half 17b. Thus, the upper and lower end head portions of the elastic tubular members 43a and 43b are supported and fixed by the duct halves 17a and 17b. The first and second seal holding members 51, 54, the first and second seal opening members 52, 53, and associated components, which are used in the second embodiment, are not used in this fifth embodiment. The work conveying system 10 of this fifth embodiment differs in the above respect from the second embodiment, but is not different in other respects for which a detailed description thereof is omitted.

In this fifth embodiment, merely by providing a pair of elastic tubular members (tubes) 43a and 43b, which on being pressed assume a balloon shape in section, a deformable sealing means 40, which covers the elongated gap 28 without obstructing the travel of the connecting member 22, is easily provided. In addition, this fifth embodiment provides the same excellent effects of the sealing means 40 as obtained with the second embodiment.

Figure 15:
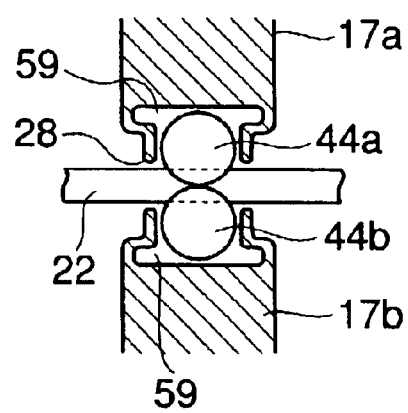
FIG. 15 is a sectional view showing a modified example of a sealing means used in the work conveying system of the fifth embodiment, in which the position of the cut is different from that in FIG. 14.
Figure 16:
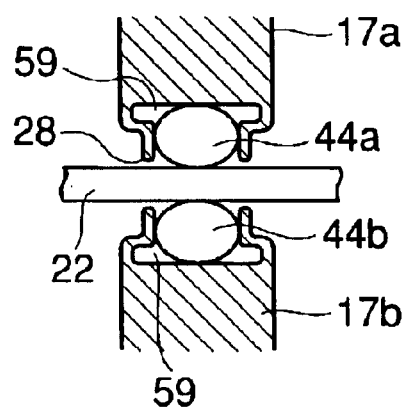
FIG. 16 is a sectional view showing the modified example, in which position of the cut is the same as in FIG. 14.
Figure 17:
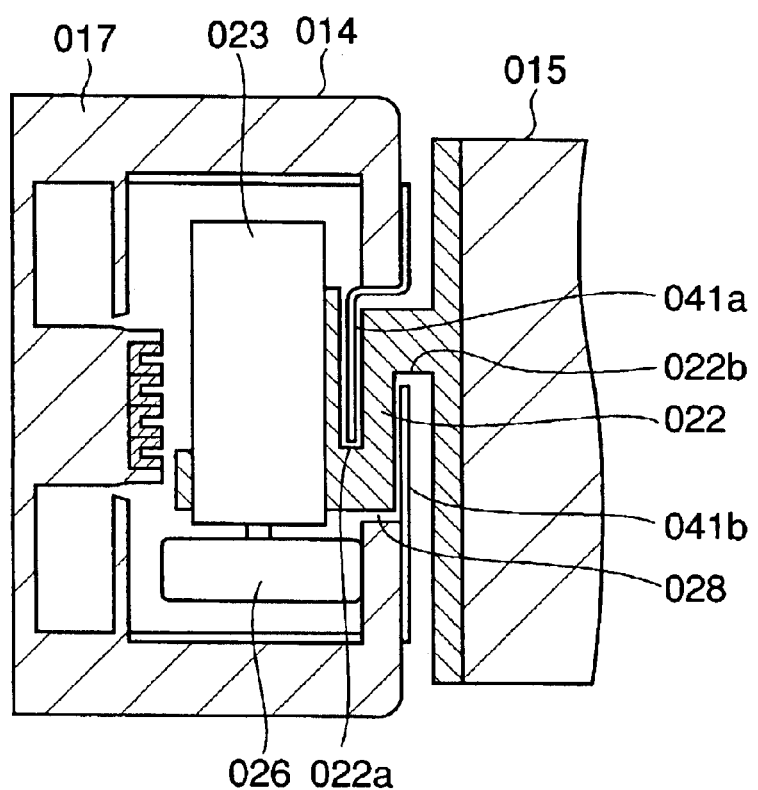
FIG. 17 is a cross sectional view of a linear moving mechanism provided in a horizontal moving means used in a conventional work conveying system.

In this fifth embodiment, the pair of upper and lower elastic tubular members which constitute the sealing means 40 may be modified in the form of upper and lower elastic tubular members 44a, 44b each having a balloon-shaped section, as shown in FIGS. 15 and 16. FIG. 15 is a sectional view of the modified example, taken at a position different from that of FIG. 14, and FIG. 16 is a sectional view of the modified example, in the same cut position as FIG. 14. In FIG. 16, the connecting member 22 passes along the elongated gap 28 while pushing apart the pair of upper and lower elastic tubular members 44a, 44b, while such is not the case in FIG. 15.

The tubular members 44a, 44b, provide the same function and effect as the pair of upper and lower elastic tubular members 43a, 43b. In the duct 17 which defines the elongated gap 28, the lower edge of the upper duct half 17a and the upper edge of the lower duct 17b are recessed at 59 so as to receive therein and fix base ends of the upper and lower elastic tubular members 44a, 44b, respectively, as shown in the figures.

The present invention is not limited to first to fifth embodiments, and various modifications may be without departing from the gist of the invention.

What is claimed is:

1. A work conveying system comprising a work holding means for holding a workpiece and a horizontal moving means for moving said work holding means horizontally in an upper ceiling space within a clean room, among plural processing stations; wherein said horizontal moving means has at least one linear moving mechanism, said linear moving mechanism comprising:
   a duct defining a traveling path and having a guide in the interior thereof, said duct having an elongated gap defined between opposing edges of said duct and extending along the length of said duct;
   a traveling body engaged with said guide for travel along said traveling path;
   a slider exterior to said duct and connected to said traveling body for travel together with said traveling body, said work holding means or another linear moving mechanism being attached to said slider;
   a connecting member connecting said slider to said traveling body and extending through said elongated gap in said duct for travel along said traveling path; and
   folding sealing means biased to extend and to normally cover said elongated gap without obstructing the travel of said connecting member.

2. A traveling path sealing structure in a work conveying system, said work conveying system including at least one linear moving mechanism, said linear moving mechanism comprising:
   a duct defining a traveling path and having a guide in the interior thereof, said duct having an elongated gap defined between opposing edges of said duct and extending along the length of said duct;
   a traveling body engaged with said guide for travel along said traveling path;
   a slider exterior to said duct and connected to said traveling body for travel together with said traveling body, a work holding means or another linear moving mechanism being attached to said slider;
   a connecting member connecting said slider to said traveling body and extending through said elongated gap in said duct for travel along said traveling path; and
   folding sealing means biased to extend and to normally cover said elongated gap without obstructing the travel of said connecting member.

3. A traveling path sealing structure according to claim 4, wherein when looking in the traveling direction of said connecting member, in front of the connecting member are provided a first seal holding member for holding said sealing means in an initially closed state and a first seal opening member for subsequently opening said sealing means while said connecting member travels through said elongated gap, and at the rear of said connecting member are provided a second seal opening member for holding said sealing means in an initially opened state and a second seal holding member for subsequently closing the sealing means as said connecting member travels along said elongated gap.

4. A traveling path sealing structure in a work conveying system, said work conveying system including at least one linear moving mechanism, said linear moving mechanism comprising:
   a duct defining a traveling path and having a guide in the interior thereof, said duct having an elongated gap defined between opposing edges of said duct and extending along the length of said duct;
   a traveling body engaged with said guide for travel along said traveling path;
   a slider exterior to said duct and connected to said traveling body for travel together with said traveling body, a work holding means or another linear moving mechanism being attached to said slider;
   a connecting member connecting said slider to said traveling body and extending through said elongated gap in said duct for travel along said traveling path; and
   folding sealing means biased to extend and to normally cover said elongated gap without obstructing the travel of said connecting member, wherein said sealing means is in the shape of bellows.

5. A traveling path sealing structure in a work conveying system, said work conveying system including at least one linear moving mechanism, said linear moving mechanism comprising:
   a duct defining a traveling path and having a guide in the interior thereof, said duct having an elongated gap defined between opposing edges of said duct and extending along the length of said duct;
   a traveling body engaged with said guide for travel along said traveling path;
   a slider exterior to said duct and connected to said traveling body for to travel together with said traveling body, a work holding means or another linear moving mechanism being attached to said slider;
   a connecting member connecting said slider to said traveling body and extending through said elongated gap in said duct for travel along said traveling path; and
   folding sealing means biased to extend and to normally cover said elongated gap without obstructing the travel of said connecting member, wherein said sealing means is biased by magnetism to normally seal said elongated gap.

6. A traveling path sealing structure according to claim 5, wherein when looking in the traveling direction of said connecting member, in front of the connecting member are provided a first seal holding member for holding said sealing means in an initially closed state and a first seal opening member for subsequently opening said sealing means while said connecting member travels through said elongated gap, and at the rear of said connecting member are provided a second seal opening member for holding said sealing means in an initially opened state and a second seal holding member for subsequently closing the sealing means as said connecting member travels along said elongated gap.

7. A traveling path sealing structure in a work conveying system, said work conveying system including at least one linear moving mechanism, said linear moving mechanism comprising:
   a duct defining a traveling path and having a guide in the interior thereof, said duct having an elongated vertical gap defined between vertically opposing edges of said duct and extending along the length of said duct;
   a traveling body engaged with said guide for travel along said traveling path;
   a slider exterior to said duct and connected to said traveling body for travel together with said traveling body, a work holding means or another linear moving mechanism being attached to said slider;
   a connecting member connecting said slider to said traveling body and extending through said elongated gap in said duct for travel along said traveling path; and sealing means biased to extend and to normally cover said elongated vertical gap without obstructing the travel of said connecting member, wherein said sealing means is a chain which hangs down from an upper of said vertically opposing edges for normally contacting a lower of said vertically opposing edges, to seal said elongated vertical gap.

8. A traveling path sealing structure in a work conveying system, said work conveying system including at least one linear moving mechanism, said linear moving mechanism comprising:

a duct defining a traveling path and having a guide in the interior thereof, said duct having an elongated gap defined between opposing edges of said duct and extending along the length of said duct;

a traveling body engaged with said guide for travel along said traveling path;

a slider exterior to said duct and connected to said traveling body for travel together with said traveling body, a work holding means or another linear moving mechanism being attached to said slider;

a connecting member connecting said slider to said traveling body and extending through said elongated gap in said duct for travel along said traveling path; and sealing means biased to extend and to normally cover said elongated gap without obstructing the travel of said connecting member, wherein said sealing means comprises a pair of elastic tubular members which press said connecting member constantly from opposing sides, and said connecting member pushing apart said pair of elastic tubular members as the connecting member travels, said pair of elastic tubular members immediately restoring to their normal extended shape after passage of the connecting member.

9. A traveling path sealing structure according to claim 8, wherein said pair of elastic tubular members are arranged vertically, one above the other.

10. A traveling path sealing structure in a work conveying system, said work conveying system including at least one linear moving mechanism, said linear moving mechanism comprising:

a duct defining a traveling path and having a guide in the interior thereof, said duct having an elongated vertical gap defined between vertically opposing edges of said duct and extending along the length of said duct;

a traveling body engaged with said guide for travel along said traveling path;

a slider exterior to said duct and connected to said traveling body for travel together with said traveling body, a work holding means or another linear moving mechanism being attached to said slider;

a connecting member connecting said slider to said traveling body and extending through said elongated gap in said duct for travel along said traveling path; and a single, unitary sealing member fixed to an upper of said vertically opposing edges and biased toward a normal position in which said sealing member is extended across said elongated vertical gap and into contact with a lower of said vertically opposing edges to seal said elongated gap.

11. A traveling path sealing structure according to claim 10 wherein said sealing member has at least one fold therein and extends and contracts by bending at said fold.

* * * * *